United States Patent [19]

Copeland et al.

[11] 4,415,759
[45] Nov. 15, 1983

[54] SOLAR POWER SATELLITE
[75] Inventors: Robert J. Copeland, Lakewood, Colo.; John D. Martin, Greenville, Tex.
[73] Assignee: Vought Corporation, Dallas, Tex.
[21] Appl. No.: 310,012
[22] Filed: Oct. 13, 1981
[51] Int. Cl.³ .......................................... H01L 31/04
[52] U.S. Cl. ................................... 136/246; 136/245; 136/251; 136/292; 244/173
[58] Field of Search ............... 136/244, 245, 259, 246, 136/251, 292; 244/173

[56] References Cited

U.S. PATENT DOCUMENTS

| | | | |
|---|---|---|---|
| 2,987,961 | 6/1961 | Cotton et al. | 350/292 |
| 3,085,565 | 4/1963 | Macauley | 126/451 |
| 3,148,846 | 9/1964 | Newton | 244/167 |
| 3,232,795 | 2/1966 | Gillette et al. | 136/246 |
| 3,326,497 | 6/1967 | Michelson | 136/244 |
| 3,346,419 | 10/1967 | Webb | 136/244 |
| 3,419,434 | 12/1968 | Colehower | 136/246 |
| 3,493,765 | 2/1970 | Kelly et al. | 250/209 |
| 3,620,846 | 11/1971 | Paine et al. | 136/245 |
| 3,690,080 | 9/1972 | Dillard | 52/108 |
| 3,756,858 | 9/1973 | Dillard | 136/245 |
| 3,781,647 | 12/1973 | Glaser | 322/2 |
| 3,841,738 | 10/1974 | Caplan | 350/293 |
| 3,905,352 | 9/1975 | Jahn | 126/425 |
| 3,906,927 | 9/1975 | Caplan | 126/438 |
| 3,957,031 | 5/1976 | Winston | 126/438 |
| 3,973,996 | 8/1976 | Kennedy | 136/244 X |
| 3,977,904 | 8/1976 | Köhler | 136/246 |
| 4,019,924 | 4/1977 | Kurth | 136/251 |
| 4,021,267 | 5/1977 | Dettling | 136/246 |
| 4,122,991 | 10/1978 | Johnston et al. | 228/13 |
| 4,131,485 | 12/1978 | Meinel et al. | 136/259 |
| 4,151,872 | 5/1979 | Slysh et al. | 160/213 |
| 4,153,474 | 5/1979 | Rex | 136/246 |
| 4,169,738 | 10/1979 | Luque | 136/246 |
| 4,217,147 | 8/1980 | Ziemba | 136/248 |

FOREIGN PATENT DOCUMENTS 2827708  1/1979  Fed. Rep. of Germany ...... 136/246

OTHER PUBLICATIONS

W. G. Woodcock III, et al., "Multi-hundred KW Solar Arrays for Space", Proceedings, 15th Intersociety Energy Conversion Conf., (1980), pp. 1390–1395.
W. Ebeling et al., "SARA-Concentrating Solar Array with Reflector-Radiators", Proceedings, 1977 Int'l. Photovoltaic Solar Energy Conf., (Publ. 1978), pp. 1056–1070.
E. E. Davis et al., "Construction of a 10 GWe Solar Power Satellite", Proceedings, 13th Intersociety Energy Conversion Conf., (1978), pp. 189–194.
L. Hsu, "A Pentahedral Pyramidal Concentrator Design for Space Solar Array", Conf. Record, 15th IEEE Photovoltaic Specialists Conf., (1981), pp. 560–564.

Primary Examiner—Aaron Weisstuch
Attorney, Agent, or Firm—James M. Cate; Stephen S. Sadacca; Charles S. Cotropia

[57] ABSTRACT

A solar power satellite (30) includes a truss structure (32) having a plurality of independently controlled solar power modules (34) mounted to one face of the truss structure. The solar power satellite is constructed in orbit by first forming and then assemblying component beam members (50, 52) to the truss structure. The solar power modules (34) are constructed on a fabrication and assembly station (36) movably attached to the truss structure and are then attached to the truss structure. The solar power modules (34) include a primary reflector (200) having a substantially parabolic curvature in cross section. A collector-radiator (202) is mounted on the primary axis of the primary reflector. The cross-sectional configuration of the collector-radiator (202) approximates a flattened inverted S-shape whereon the radius of curvature decreases as the curve approaches both its center and its end furthermost from the primary reflector (200). The primary reflector (200) is contoured to reflect sun light onto the collector-radiator structure (202). The collector-radiator structure includes a plurality of spaced radiant energy converting cells (450). A plurality of light reflective fins (452) are positioned between the converter cells. Each fin is thermally and electrically connected to converter cells on each side thereof. The fins provide radiant cooling of and series electrical connection between the converter cells. The fins also serve as a secondary reflector for concentrating sun light from the primary reflector onto the converter cells.

57 Claims, 19 Drawing Figures

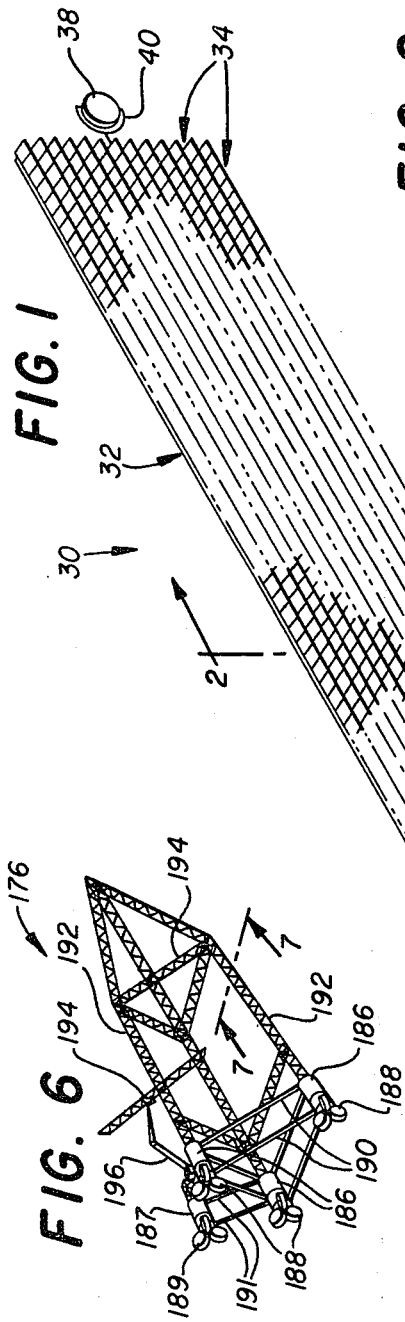
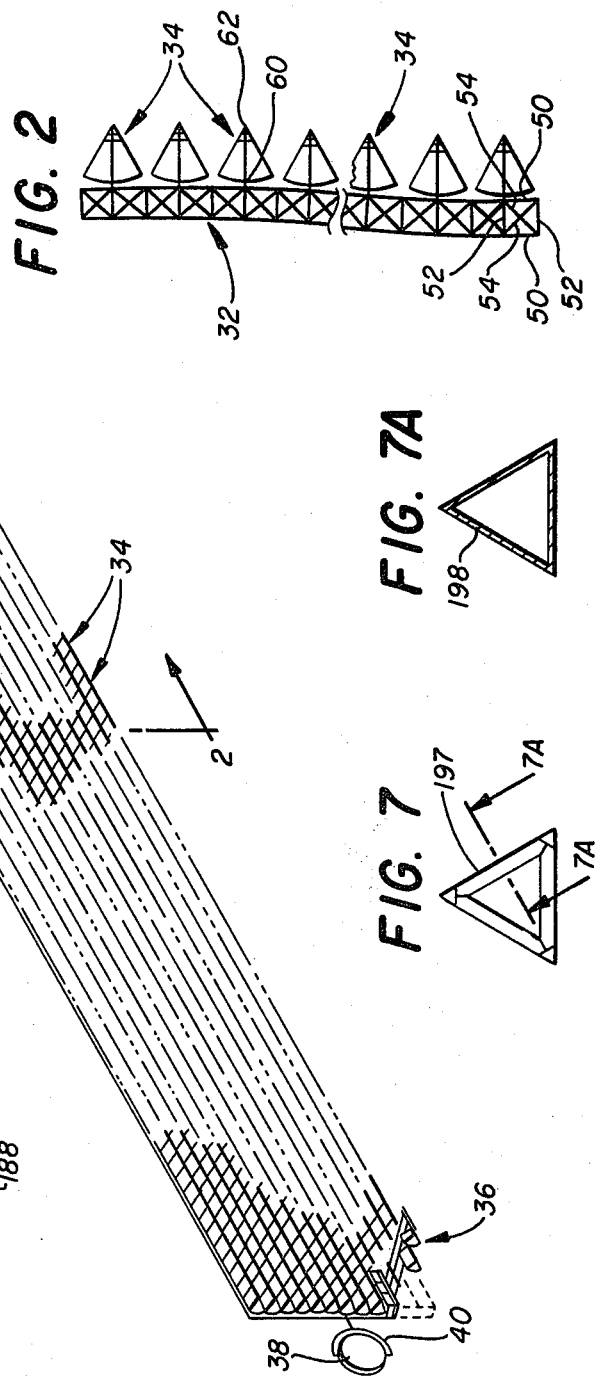

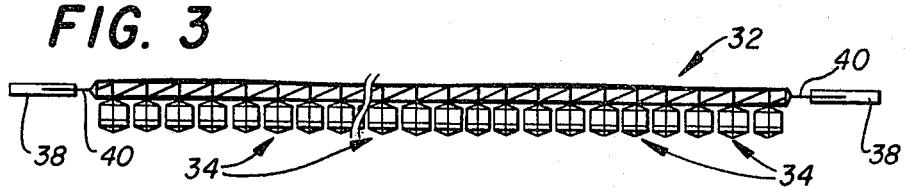
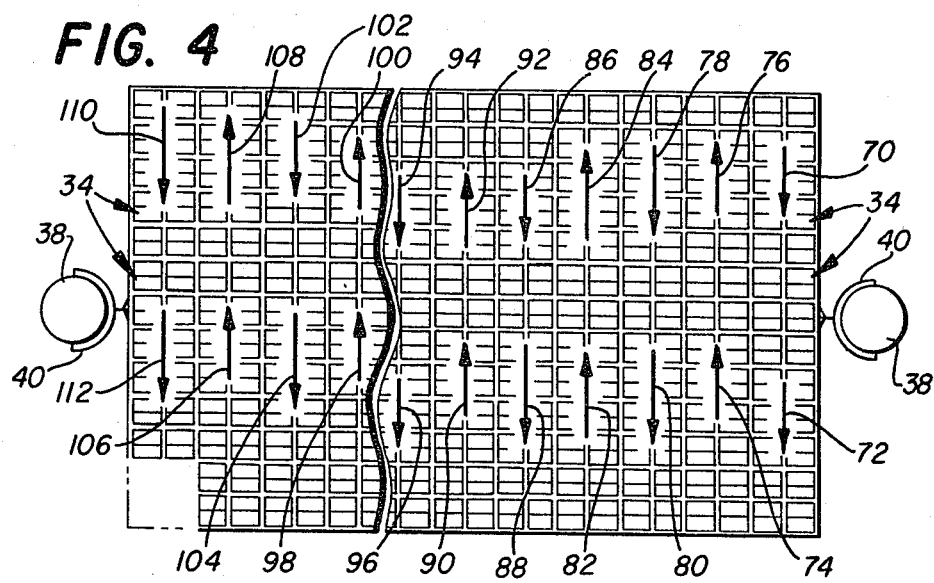
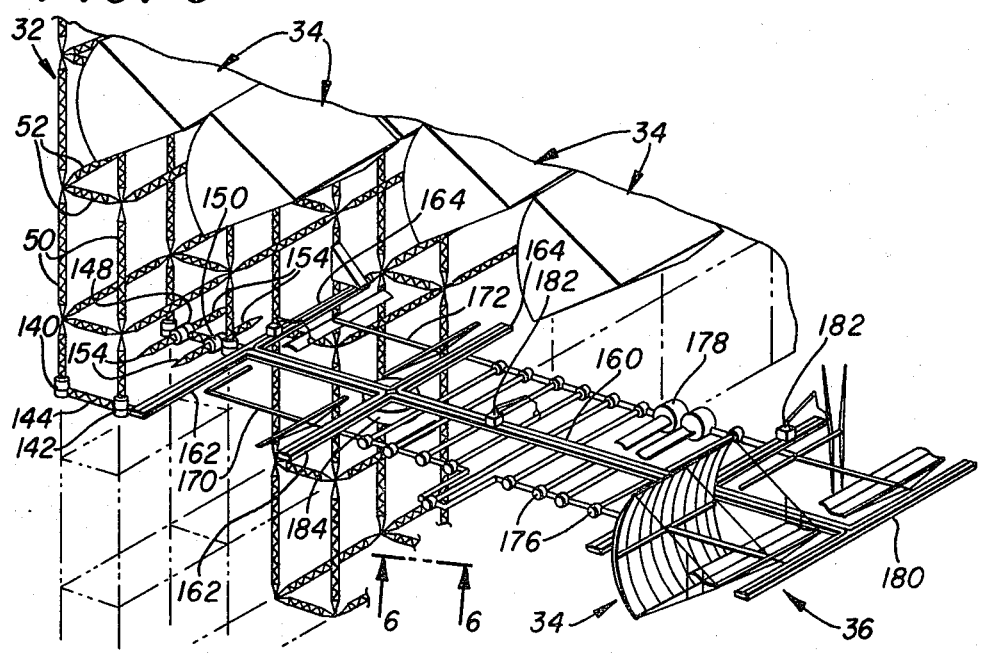

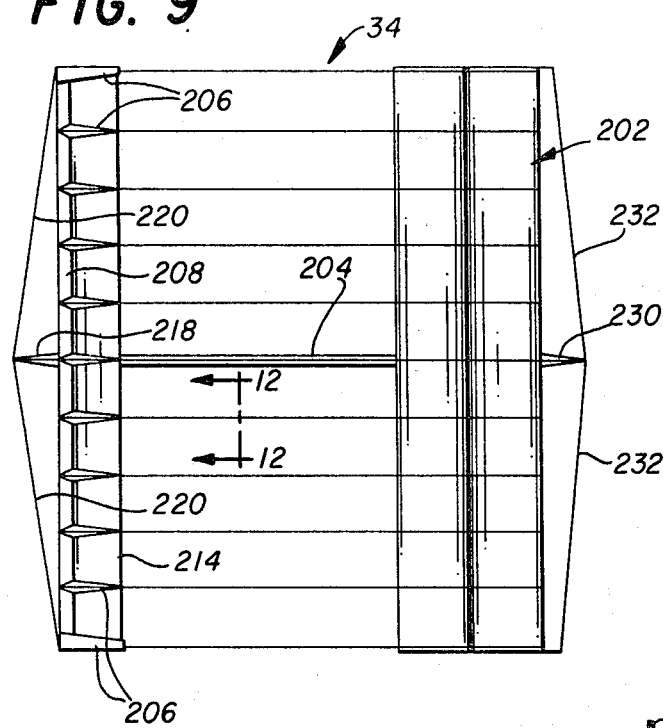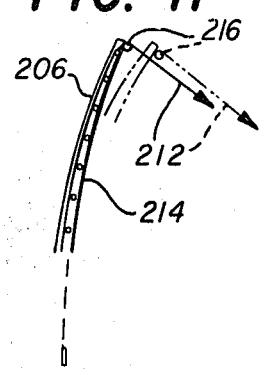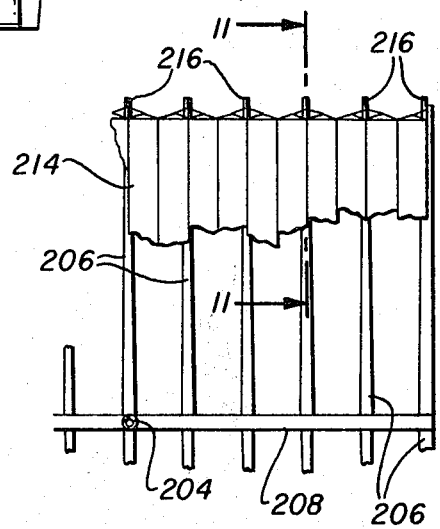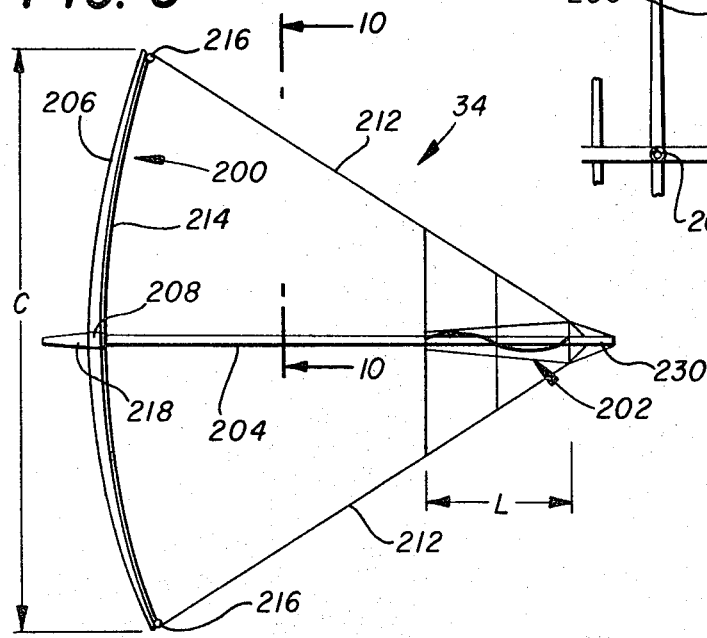

U.S. Patent   Nov. 15, 1983   Sheet 4 of 5   4,415,759
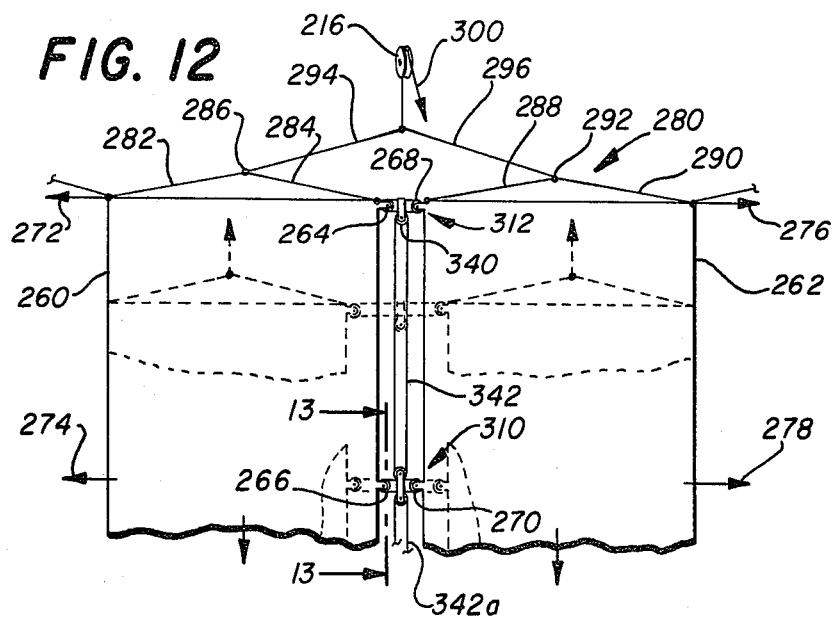
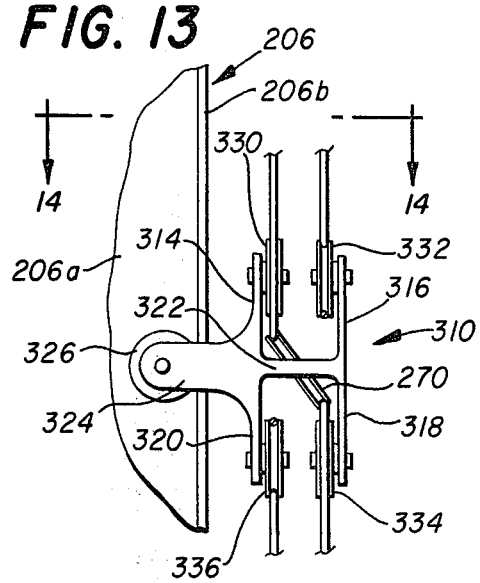
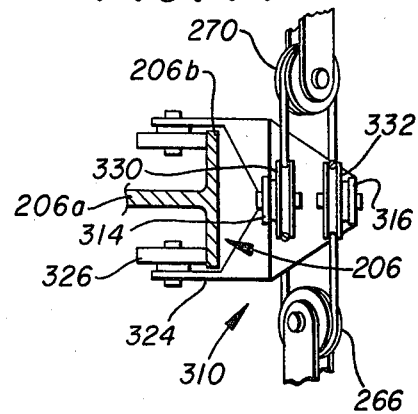

SOLAR POWER SATELLITE

TECHNICAL FIELD

The present invention relates to radiation cooled solar cell modules incorporating primary and secondary reflectors. In a preferred embodiment, the modules are assembled in space as a part of an earth orbiting satellite.

BACKGROUND ART

Solar power has been recognized as a potential primary source of electrical energy. The benefits of using solar power satellites for generating electrical energy which is beamed to the earth by microwave have also been recognized. These benefits include the avoidance of absorption of solar energy by the atmosphere, obscuration by clouds or dust and avoidance of atmospheric effects on the solar power structure. Further, solar power satellites avoid the limited availability of the sun's radiation at low sun angles and the lack of any solar energy at night. By avoiding these interruptions in solar energy associated with earth based units, solar power satellites eliminate the need for standby storage units normally required in earth based solar cell assemblies. Satellite based solar power units also permit the construction of units of sufficient size, normally on the order of many square miles, necessary to produce electric power at a capacity which make such a project economically feasible.

Several satellite based units have been proposed. For example, such a unit is disclosed in U.S. Pat. No. 3,781,647, issued Dec. 25, 1973, to Peter E. Glaser. Such units have normally required active cooling systems which have made the systems uneconomical. Further, although primary and secondary reflective configurations used in conjunction with solar cells have been proposed in land based solar cell units, such as shown in U.S. Pat. No. 3,419,434, issued Dec. 31, 1968 to E. W. Colehower, such configurations have not provided an optimum solar assembly readily adaptable to satellite based units. U.S. Pat. No. 4,131,485, issued Dec. 25, 1978 to Meinel et al also discloses a solar cell unit employing a primary and secondary reflector arrangement. However, this unit fails to provide an optimum arrangement.

In solar power satellites, solar cells represent approximately 50–80% of the satellite cost at concentration ratios of two. Thus, a cost reduction is achieved if sunlight can be concentrated with low cost reflectors. Additionally, in solar power satellites, solar cells must be properly cooled to maintain a high efficiency. Effective radiation cooing provides a significant cost and weight savings over active cooling systems which require heat exchange fluid and the associated pumps and other structure needed to operate active cooling systems.

Further, an effective solar power satellite must provide a low cost method to fabricate and control the reflector, none of which is now provided by the prior art.

DISCLOSURE OF THE INVENTION

The present invention provides a solar power satellite of a unique design having the potential of reducing the cost of the satellite by a factor of two or more. This cost reduction is achieved by concentrating sunlight with a low cost reflector. Further, the present invention provides a radiation cooled solar cell unit, thereby avoiding the weight and cost of heat exchange fluid and related structure required for an active cooling system.

In one embodiment of the invention, a solar power satellite includes a substantially planar truss structure having a plurality of independently controlled solar power modules mounted to one face of the truss structure. Each solar module is independently controllable to align the structure to a proper orientation facing the sun. This control permits the maximum use of solar energy while permitting the truss structure to be flexible and therefore constructed from lightweight materials. The truss structure is itself oriented in a solar facing relation and electrical energy produced by the solar modules is collected in series and transmitted to an earth based receiver by way of microwave.

In accordance with one method of the invention, the solar power satellite is constructed in orbit by first forming and then assemblying component beam members to form a substantially planar truss structure. The components of the solar power modules are constructed on a fabrication and assembly station movably attached to the truss structure and are assembled and moved to the base of the fabrication and assembly station for attachment to the truss structure. This process is completed in sequence, resulting in the simultaneous construction of the truss structure with the solar power modules mounted in rows and columns to completely fill one face of the truss structure. Orienting means are provided for aligning the face of the truss structure having the solar power modules mounted thereto toward the sun. Additionally, each individual solar module is automatically controlled to maintain alignment with the sun in response to flexing of the truss structure.

In accordance with a preferred embodiment of the invention, the solar power modules include a primary reflector having a substantially parabolic curvature in cross section. A collector-radiator is mounted on the primary axis extending perpendicularly from the midpoint of the primary reflector and includes a downwardly facing concave first curved portion of decreasing radius of curvature from the end adjacent the primary reflector to the second end thereof. An upwardly facing concave second curved portion is positioned adjacent the first curved portion with its first end adjacent the second end of the first curved portion. The second curved portion has a radius of curvature decreasing from the first end to the second end. Solar cell units are mounted on the concave surface of the first and second curved portions of the collector-radiator assembly. The solar cell units have an energy receiving surface responsive to radiation energy received thereon to generate electric energy.

The upper curvature of the primary reflector is contoured to reflect rays onto the concave second curved portion of the collector-radiator structure. The lower portion of the primary reflector is contoured to reflect rays onto the concave first curved portion of the collector-radiator structure.

As will hereinafter be discussed in greater detail, the downwardly facing concave first portion of the collector-radiator structure is positioned substantially in line with the upwardly facing concave second portion of the collector-radiator structure substantially on the primary axis from the primary reflector. As a result of this spacing, the collector-radiator structure, and the converter cells positioned thereon, may be more efficiently cooled, thereby increasing efficiency of these units.

Further, the primary reflector may be contoured to maximize the sunrays reflected from the primary reflector to the collector-radiator structure.

In the preferred embodiment, the collector-radiator unit includes a plurality of spaced radiant energy converting cells having an energy receiving surface responsive to radiant energy received thereon for generating electric energy. A plurality of light reflective fins are positioned between the converter cells. Each fin is thermally and electrically connected to converter cells on each side thereof. The electrical connection between the fin and the converter cell on one side is to the energy receiving surface of the converter cell. On the opposite side, the fin is connected to the surface of the adjacent cell opposite the energy receiving surface. These fins provide series electrical connection between the converter cells.

In the preferred embodiment, the fins include a three layer composite having a specularly reflective upper layer, an electrically and thermally conductive foil attached to the upper layer and a high emittance coating on the side of the foil opposite the reflective upper layer. The high emittance coating provides high heat dissipation properties. The conductive foil provides for series connection between the various converter cells. The specularly reflective upper layer serves as a secondary reflector for concentrating light energy on the converter cell energy receiving surfaces.

The light reflective fins are positioned at an angle of about 115° from the plane of the converter cells. The fins have a width of approximately 3½ times the width of the converter cells and the converter cells are mutually parallel, one to the other. Likewise, the heat dissipating and light reflective fins are mutally parallel, one to the other.

Each radiant energy converter cell has an electrically conductive grid mounted on an electrical contact with the energy receiving surface of the energy converter cells. In the preferred embodiment, a metallic plate is positioned between the first end of the conductive foil and the grid. An electrically and thermally conductive adhesive is used for connecting the second end of the conductive foil opposite the first end to the surface of an adjacent converter cell. This attachment to the converter cell is on the surface opposite the energy receiving surface or the electrically conductive grid. The first end of the conductive foil is also connected to the converter cell on the surface opposite the energy receiving surface using a thermally conductive but electrically nonconductive adhesive.

As a result of this arrangement, the converter cells are electrically connected in series by way of the electrically conductive foil. The converter cell is connected electrically on one side at a surface opposite the energy receiving surface and on the opposite side to an adjacent fin at the electrically conductive grid. Thermal connection of the converter cells to adjacent fins is by way of a thermally conductive adhesive attaching the conductive foil to the underside of the converter cell opposite the energy receiving surface thereon.

A protective coating may be applied to the energy receiving surface and over the electrically conductive grid. This coating seals the grid to the converter cell while providing protection to the grid.

With respect to the structure of the solar power modules, the primary deflector includes a plurality of flexible ribs interconnected in a substantially parallel arrangement by a deflector beam structure connected to the ribs at a point intermediate of the ends of the ribs. A central column extends substantially perpendicularly from the reflector beam. The collector-radiator assembly is connected to the central column at a point spaced from the primary reflector. Cables are attached between the collector-radiator assembly and the ends of the ribs. A thin foil sheet covers the ribs to form a reflective surface. By adjusting the cable tension, the ribs may be flexed to produced the desired curvature for the reflective surface on the primary reflector. If the preferred embodiment, the overall height of the primary reflector is approximately four times the overall length of the collector-radiator assembly.

BRIEF DESCRIPTION OF DRAWINGS

For a more complete understanding of the present invention, and for further details and advantages thereof, reference is now made to the following description taken in conjunction with the accompanying drawings, in which:

FIG. 1 is a perspective view of the solar power satellite of the present invention;

FIG. 2 is an enlarged section view taken along line 2—2 of FIG. 1;

FIG. 3 is an enlarged top view of the solar power satellite of FIG. 1;

FIG. 4 is an enlarged plan view of the solar power satellite of FIG. 1;

FIG. 5 is an enlarged perspective view showing an edge of the solar power satellite in the process of construction and assembly;

FIG. 6 is an enlarged view taken along line 6—6 of FIG. 5 showing in more detail the construction of truss elements of the solar power satellite of the present invention;

FIG. 7 is an enlarged section view taken along line 7—7 of FIG. 6;

FIG. 7A is an enlarged section view taken along line 7A—7A of FIG. 7;

FIG. 8 is an enlarged plan view showing one of the solar power modules incorporated in the present invention;

FIG. 9 is a top view of the solar power module shown in FIG. 8;

FIG. 10 is a section view taken along line 10—10 of FIG. 8;

FIG. 11 is a section view taken along line 11—11 of FIG. 10 showing the tensioning of one of the flexed ribs of the solar power module of the present invention;

FIG. 12 is an enlarged view as seen from along line 12—12 of FIG. 9 showing the upper end of one of the ribs of the primary reflector incorporated in the present invention;

FIG. 13 is an enlarged section view taken along line 13—13 of FIG. 12;

FIG. 14 is a section view taken along line 14—14 of FIG. 13;

DETAILED DESCRIPTION

Figure 15:
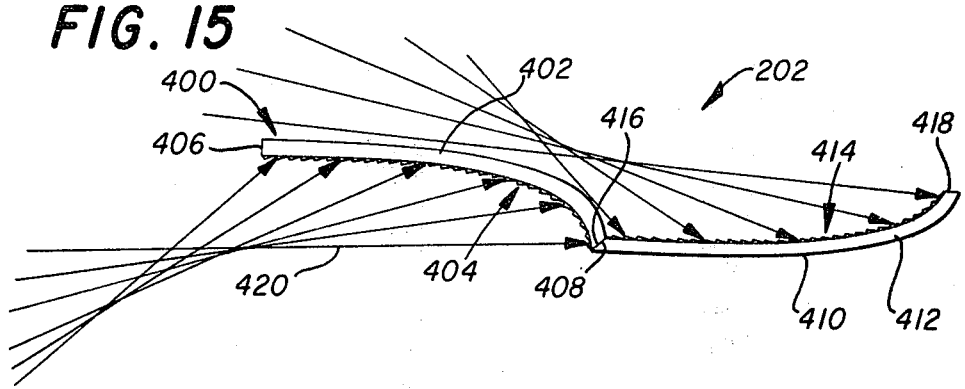
FIG. 15 is an enlarged side plan view showing the collector-radiator assembly of the present invention.

Referring to FIG. 1, the present invention is to a solar power satellite 30 having a large platform structure 32 for receiving and supporting a plurality of solar power modules 34 attached along rows and columns as shown. As seen in FIG. 1, and as will be described hereinafter in greater detail, a space fabrication and assembly station 36 is shown in progress of constructing the elements of the solar power modules 34 for attachment to the platform structure. Microwave antennae 38 are attached by appropriate structure 40 to platform structure 32 and operate to beam electric power produced by the modules to earth according to practices known in the art.

The platform structure is intended to be constructed as a space station in earth orbit and continuously oriented with its major plane perpendicular to the sun's rays. Each solar power module 34 is also individually positionable relative to the framework to accommodate flexure of the relatively lightweight, but extremely large framework. Although the platform structure may be of any particular size, in a preferred embodiment of the invention, platform structure 32 is 34 kilometers long by approximately 5 kilometers wide.

FIGS. 2 and 3 show the mounting of the individual solar power modules 34 to platform structure 32. As is seen in these FIGURES, platform structure 32 is constructed from a plurality of truss members forming a lattice type frame, each cell of the frame including side truss members 50, upper and lower truss members 52 and diagonal truss members 54. Solar power modules 34 are attached to their base to the platform structure 32 by an appropriate control motor positioned at point 60 therebetween operated by a sun sensor mounted at the apex 62 of modules 34.

As will be apparent from the further description provided hereinafter, the present invention incorporates extremely thin structures which, although capable of withstanding the loads encountered in space, do not provide a rigid structure. It is also recognized in the present invention that in view of the size of the solar power satellite, the structure will experience various forces resulting in nonuniform deflections therein. This difference in forces is in part due to the fact that a gravitational torque is imposed on the structure as a result of the tendency of the portion of the satellite closer to the earth to move faster than that portion furthermost from the earth. Because the unit is maintained in an orientation always facing the sun, this gravitational torque will be applied over different areas of the structure, causing it to undergo nonuniform deflection. Therefore, the present invention envisions the use of individually tracking solar power modules. As is shown in FIGS. 2 and 3, the modules maintain their proper orientation relative to the sun even in view of deflections which are experienced in the platform structure to which they are attached.

FIGS. 4 and 5 illustrate the construction of the solar power satellite through use of progressive assembly techniques. Referring to FIG. 4, the construction is begun in the upper right-hand quadrant of the solar power satellite and follows the progression of construction indicated by arrows 70 through 112.

Thus, the progression of construction is such that a portion of the platform structure is completed with the simultaneous construction of the solar power modules 34 which are attached thereto. The progression continues to the left, as illustrated in FIG. 4, following the course indicated by arrows 72–112.

FIG. 5 provides a detailed illustration of the construction and assembly of both the platform structure and solar power modules at the lower left-hand quadrant of the satellite. It will be appreciated that power modules are omitted in some areas in FIG. 5 for purposes of clarity. Diagonal truss members are also omitted for clarity.

The platform structure 32 is composed of a plurality of vertical truss members 50 interconnected by a plurality of horizontal truss members 52. These members are in turn composed of a plurality of interconnected struts as is shown in FIG. 5. Each member is made in progression and assembled to progressively build the platform structure. For example, vertical trusses 50 are manufactured in units 140 and 142. Units 140 and 142 are interconnected by an intermediate truss 144 and moved progressively downwardly as trusses are constructed and assembled. Similarly, horizontal trusses 52 are made from module units 148 and 150 interconnected by an appropriate truss 152. FIG. 5 shows a plurality of trusses 154 in partial completion.

Although several materials, such as aluminum or graphite epoxy, may be used in the construction of the truss members of the solar power satellite herein disclosed, in the preferred embodiment, aluminum sheet having a thickness of the order of 0.005 inches is used to form struts having a triangular cross section. These struts are in turn used to make up the larger truss members such as members 50 and 52.

FIG. 5 further discloses the fabrication and assembly station for construction and placement of the solar power modules 34. This station includes a main beam 160 extending from the platform structure at unit 142. Lateral beams 162 and 164 extend transversely from beam 160 adjacent the connection of beam 160 to unit 142. Subframe members 170 and 172 extend laterally from beams 162 and 164, respectively, and parallel to main beam 160. A plurality of beam forming units 176 are supported along subframes 170 and 172 and progressively produce therefrom the beams used in constructing the solar power modules 34. Additionally, differing construction units such as those indicated by the numeral 178 are used to construct the collector-radiator assembly to be described hereinafter in greater detail. A transverse beam 180 is connected at the end of main beam 160 positioned laterally thereto.

Track manipulators 190 (FIG. 6) are adapted to move on the various frame structures. These manipulators are used to move completed beams and components to the assembly location for constructing the solar power modules. These units are also used to move the completed solar power modules to their point of assembly to the platform structure.

Administration and crew quarters unit 192 is shown attached to main beam 160. This unit may also be used for manufacturing control and maintenance. Of course, other units can be positioned on main beam 160 as needed.

FIG. 5 shows one of the modules 34 completed and other modules in various stages of completion. Once module 34 is completed, it is moved from its position on fabrication and assembly station 36 to its point of attachment to platform structure 32 using one of the track manipulators.

FIG. 6 shows one of the beam forming units 176 in greater detail. The forming unit includes three triangularly spaced assembly stations 186 having a plurality of material feeding spools 188 attached thereto. Stations 186 are maintained in position by struts 190. A fourth station 187 is positioned to one side of stations 186 by struts 191 and has feeding spools 189, similar to those associated with stations 186, attached thereto. Spools 188 and 189 contain the material, such as aluminum sheeting, used to construct the struts used to form the truss members. This material is withdrawn from the material spools and the necessary operation, including bending and welding, takes place within stations 186 to form the truss members. As is seen in FIG. 6, longitudinal truss members 192 extend from stations 186 and continue to lengthen as they are progressively assembled within stations 186. Station 187 is used to construct transverse truss members 194. A crane manipulator 196 is mounted on one of the stations 186 and is used to move the lateral beams from station 187 after construction to their point of attachment to the truss members 192.

FIG. 7 shows one of the truss members 192 in cross section. The members are composed of struts 197, shown in cross section in FIG. 7A. Struts 197 are connected at their ends to form a triangular truss member as shown. Referring to FIG. 7A, the individual struts are made up from aluminum sheets 198 formed into a triangular cross section.

The structure of the solar power modules 34 is shown in greater detail in FIGS. 8-14. Referring to FIGS. 8 and 9, modules 34 include a primary reflector assembly 200 with a solar collector-radiator assembly 202 connected thereto by a central column 204. Primary reflector 200 consists of a plurality of flex ribs 206 interconnected by a reflector beam 208. As is shown in FIG. 8, the dimension L of the collector-radiator 202 is approximately ¼ the overall length C of the primary collector frame.

Reflector beam 208 is connected to central column 204 as is shown in FIGS. 9 and 10. Flex ribs 206 receive a reflective sheet 214 thereover to provide a reflective surface for directing solar energy onto the collector-radiator assembly 202. Ribs 206 are flexed to take on a parabolic contour by the application of a tension force thereto through cables 212 extending from pulleys 216 mounted on the ends of flex ribs 206. Cables 212 are connected at their opposite ends to the solar collector-radiator assembly. Although the curvature of the flexed ribs may be generally defined as being parabolic, as will hereinafter be described in greater detail, the curvature of the primary reflector is not symmetric about a plane through central column 204 and reflector beam 208. Rather, the reflector is contoured to provide the maximum solar reflection onto collector-radiator assembly 202.

Referring to FIG. 9, a strut 218 extends outwardly from reflector beam 208 in line with central column 204. Cables 220 are attached from the outermost end of strut 218 to reflector beam 208 at the outermost rib 206. These cables provide support to the reflector beam transmitting loads applied thereto into central column 204. Similarly, a strut 230 extends from collector-radiator assembly 202 in line with central column 204. A pair of cables 232 extend from the outermost point of strut 230 and is tied to the outermost end of collector-radiator assembly 202 to provide support thereto.

As can be seen in FIGS. 9 and 10, a plurality of ribs are spaced in a parallel relation side by side to form the structure for primary reflector 200. Cables 212 extend from the outermost point of each rib in a parallel relation to collector-radiator assembly 202. As is shown in FIG. 11, by drawing in on cables 212, flex ribs 206 may be bent to provide the desired contour of the flex ribs and therefore of the reflective covering which conforms to it.

FIGS. 12 through 14 provide a more detailed disclosure of both the tensioning of cables 212 and of the reflective covering 214 of the primary reflector 200. Referring to FIG. 12, the reflective foil covering 214 includes a plurality of rectangular sheets identified by numerals 260 and 262. Although it will be apparent to those skilled in the art that different reflective films can be used, a 0.005 inch aluminum sheet is used in the preferred embodiment. Pulley assemblies 264 and 266 are attached to the upper right-hand corner and side, respectively, of sheet 260. Similarly, pulley assemblies 268 and 270 are attached to the upper left-hand corner and side, respectively, of sheet 262. Arrows 272 and 274 on sheet 260 represent pulley assemblies corresponding to 264 and 266, respectively, and the arrow direction indicates the tension applied to the sheet through these pulleys. Similarly, arrows 276 and 278 represent pulley assemblies corresponding to pulley assemblies 268 and 270 on sheet 262 and indicate the direction of tension applied to the sheet through these pulley assemblies.

A harness arrangement 280 is attached to the upper ends of sheets 260 and 262 for applying a tensioning force to the sheets. This harness arrangement includes equal length cables 282 and 284 connected to and extending from the upper left and right corners of sheet 260 and connected together over the midpoint of the sheet at point 286. Similarly, cables 288 and 290 are connected to and extend upwardly from the left and right corners of sheet 262 and are connected above the midpoint of the sheet at point 292. Cable 294 is connected to cables 282 and 284 at their connection at point 286. The opposite end of cable 294 is attached to cable 296 which extends from the point of connection of cables 288 and 290 at their connection at point 292. The cables 294 and 296 are equal in length. A main tension cable 300 is attached at the point of connection between cables 294 and 296 and extends over pulley 216 attached to the outermost end of flex rib 206.

The confronting sides of sheets 260 and 262 are drawn together using pulley carriers 310 and 312. Shown in detail in FIGS. 13 and 14, carrier 310 consists of an H-shaped frame having legs 314, 316, 318 and 320 extending from a midbar 322. A pair of lugs 324 extend from the H-shaped frame and carry rollers 326 thereon. Flex ribs 206 have a web portion 206a with a flange 206b extending laterally therefrom. Rollers 326 engage flange 206b and are carried therealong. A pulley 330 is carried on leg 314 and pulleys 332, 334 and 336 are carried on legs 316, 318 and 320, respectively.

Pulley carrier 312 is similar to carrier 310 except that carrier 312 has only a pair of pulleys positioned parallel to the plane of flex rib flange 206b rather than four such pulleys as exists in pulley carrier 310. These pulleys are designated in FIG. 12 by numeral 340.

A cable 342 is used to interconnect pulley carrier 310 with pulley assemblies 266 and 270 of sheets 260 and 262, respectively, and pulley carrier 312 to pulley assemblies 264 and 268 of sheets 260 and 262, respectively. Referring to FIG. 12, this engagement can be described beginning at the lower portion of cable 342 designated by the numeral 324a. From this point, cable 342 is engaged around pulley 366 (FIG. 13), around pulley assembly 266 on sheet 260, around pulley 332 (FIG. 13) of carrier 310 and upwardly to pulley 340 on carrier 312. The cable is then entrained about pulley assembly 264 of sheet 260, around pulley assembly 266 attached to sheet 262 and around and downwardly from pulley 340 of carrier 312. The cable is engaged around pulley 330 (FIG. 13), around pulley 270 of sheet 262 and thereafter around pulley 334 (FIG. 13) and downwardly to other similar pulley assemblies.

As can now be appreciated from a review of FIGS. 12 through 14, foil sheets 260 and 262, as well as other similar sheets, may be expanded from the contracted position illustrated in phantom in FIG. 12, to the fully extended position by drawing up cable 342. Additional expansion is obtained by drawing in main tension cable 300 about pulley 216 attached to the outer end of the flex rib 206 to fully extend the foil cover.

FIGS. 15 through 18 show the collector-radiator assembly 202 in further detail. Referring specifically to FIG. 15, assembly 202 includes a downwardly facing concave first curved portion 400 having a skeletal support structure 402 with a solar cell assembly 404 mounted on the concave surface thereof. Portion 400 extends from a first end 406 to its second end 408 and has a decreasing radius of curvature from end 406 to end 408.

An upwardly facing concave second curved portion 410 is connected to and extends to one side of curved portion 400. Curved portion 410 also has a support structure 412 with a solar cell assembly 414 mounted on the concave surface thereof. The second curved portion has a decreasing radius of curvature from its first end 416 to its second end 418. The first curved surface and the second curved surface are joined with the second end of curved portion 400 attached to the first end of curved portion 410.

As is shown in FIG. 15, the elongated collector-radiator assembly 202 is of a particular cross-sectional configuration adapted to receive solar energy, represented by arrows 420, reflected toward it from the primary reflector. Reflection is at angles of incidence to the major plane of collector-radiator assembly 202 varying between about 20° and 45°. Generally, the cross-sectional configuration of the collector-radiator assembly approximates a flattened inverted S-shape whereon the radius of curvature decreases as the curve approaches both its center and its end furthermost from the primary reflector.

Figure 16:
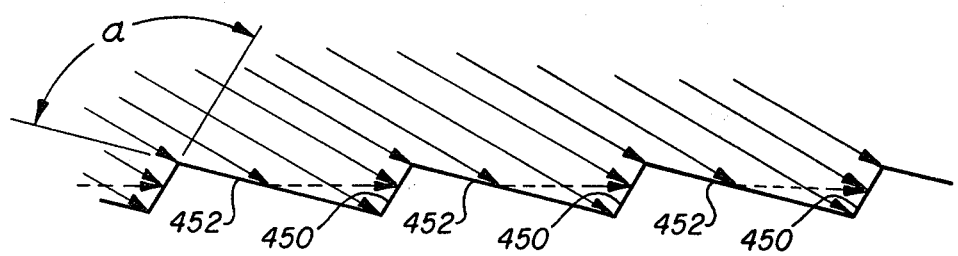
FIG. 16 is a further enlarged side plan view showing a portion of the surface of the collector-radiator assembly shown in FIG. 15.

As is shown on an enlarged scale in FIG. 16, the collector-radiator assembly 202, in local cross section, comprises a series of spaced radiant energy converting cells 450. These cells may be photovoltaic cells generally known in the art. These converter cells are mutually parallel one to the other and are interconnected by a plurality of reflector-radiator fins 452. As can be seen in FIG. 16, fins 452 are also mutually parallel one to the other, and are at an angle α of approximately 115° from the surface of the converter cells. Fins 452 are provided for both reflecting solar energy toward respective ones of the converter cells and for radiating heat energy away from the solar cells. Additionally, fins 452 act as a means for electrically connecting the converter cells serially one to the other.

Figure 17:
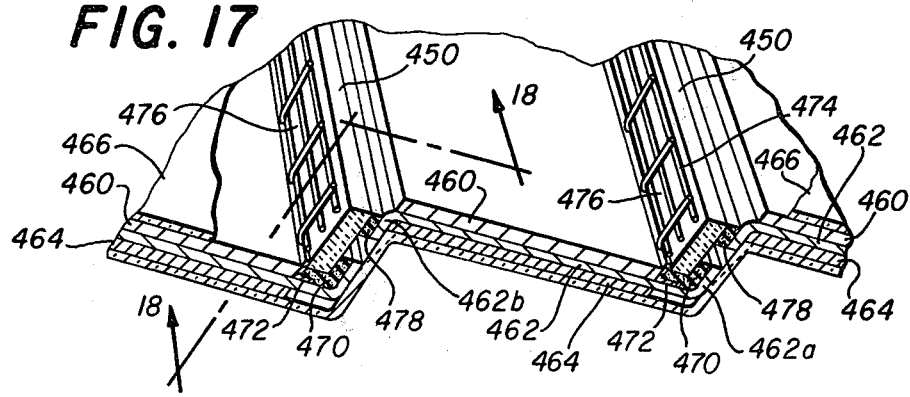
FIG. 17 is a perspective section view of the surface shown in FIG. 16 of the collector-radiator assembly.
Figure 18:
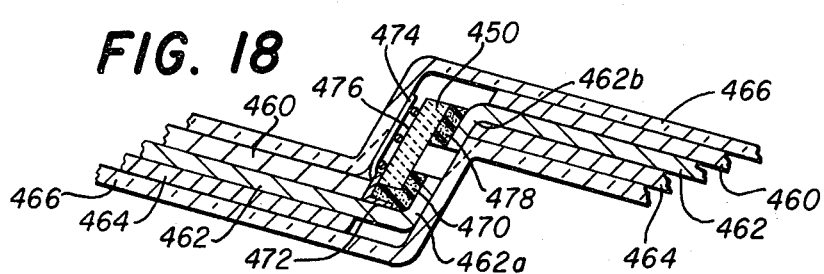
FIG. 18 is a section view taken along line 18—18 of FIG. 17 of the collector-radiator assembly.

Referring to FIGS. 17 and 18 wherein these features are more clearly defined, fins 452 comprise a three layer composite structure having a specularly reflective upper layer 460, an electrically and thermally conductive foil strip 462 attached to the upper layer and a high emittance coating 464 on the side of the foil opposite the reflective upper layer. The reflective upper layer may be a silverback teflon with the foil layer attached to the nonreflective side of the layer. The fin extends at an approximately 115° angle from the surface of the respective, adjacent converter cell and its width is approximately 3.5 times that of the solar cell. This relationship provides a 2:1 concentration of solar energy from the converter cell which is in addition to the amplification provided by the primary reflector 200. A clear protective coating 466 is applied to the energy receiving surface and over the electrically conductive grid. This coating seals the grid to the converter cell while providing protection to the grid.

FIGS. 17 and 18 further illustrate the series electrical connection between converter cells 450 and the respective foil layers 462 of the reflector-radiator fins 452. Each foil layer 462, with the exception of the uppermost segment, is affixed at its first edge 462a to the lower surface of one of the converter cells by adhesive 470 which is thermally conductive but electrically insulative. Additionally, each foil layer 462 is electrically connected, as by metallic flange member 472, to an electrically conductive grid 474 mounted on and in electrical contact with the energy receiving surface 476 of each converter cell. The opposite second edge of each conductive foil strip 462 is affixed to a portion of the underside of the next adjacent converter cell by an adhesive 478 which is both electrically and thermally conductive. Such an adhesive may be one which is suitably impregnated with metallic particles. In this way, a series of electrical generating cells is provided.

Each converter cell is afforded efficient cooling by its physical, thermal connection to the conductive foil strips on either side thereof. The relatively large area of the high thermal emittance coating 464 efficiently radiates heat from foil layer 462 and the converter cell. Because of the close proximity of the reflective-radiator fins 452 to the converter cells 450, and because of the relatively large surface area of the emittance coating 464 as compared with the size of the converter cells, an "active cooling" system of the type in which a coolant is circulated through the radiator and/or the converter cell is not needed.

As a result of this arrangement, current from one converter cell is transferred through foil strips 462 to the next converter cell where the same current is passed out but the voltage is increased by passing through the converter cell. It will thus be appreciated that the foil strip serves as an electrical connection between the converter cells, as well as a component of a heat emitting fin which provides the necessary radiating effect to cool the overall system.

Further, the inverted S-shape of collector-radiator assembly 202 results in a more effective cooling mechanism. Because the first curved portion and second curved portion of assembly 202 are displaced one from the other, more effective radiation of heat energy is achieved, resulting in a higher power output. If the two curved portions were placed adjacent to each other, less radiant cooling would occur and the system would run hotter and therefore less efficiently. Although the two portions of assembly 202 are separated, the construction of primary reflector 200 permits focusing of light reflected from the upper half and the lower half of the reflector onto the solar cell assemblies mounted on collector-radiator assembly 202. Although the primary reflector generally takes on the configuration of a parabola, because the first curved portion and second curved portion of assembly 202 are positioned at different distances from the primary reflector, the curvature of the upper portion of the primary reflector will be slightly different from the curvature of the lower portion. Collector-radiator assembly 202 is positioned along the focal line or linear region of the primary reflector and the reflector is appropriately contoured to focus light rays reflected from the upper portion to the curved surface onto the second curved portion, and the lower portion of primary reflector 200 is contoured to focus reflected rays onto the first portion of assembly 202.

Therefore, the present invention discloses a solar power satellite which provides for high concentration of sunlight on converter cells maintained on a unique collector-radiator assembly operating in conjunction with a primary reflector. The converter cells are positioned in an inverted S-shape which facilitates radiant cooling of the cells. The converter cells are further separated by secondary reflectors which act not only to provide radiant cooling to the cells, but serve as secondary reflectors for concentrating light onto the converter cells. The interconnecting fins also serve to electrically connect each converter cell in series.

While the present disclosure has discribed the invention as used in a space environment having relatively large overall dimensions, it will be appreciated that much smaller units than those described may be employed. Moreover, it will be understood that the individual solar cell modules or groups thereof may be incorporated for land base use. Similarly, the specific geometry of the collector-radiator assembly may be used separate and apart from either the primary reflector or the particular inverted S-shape arrangement incorporating the features providing radiant cooling, as well as the serial electrical connection provided therein.

Although preferred embodiments of the invention have been described in the foregoing detailed description and illustrated in the accompanying drawings, it will be understood that the invention is not limited to the embodiments disclosed, but is capable of numerous rearrangements, modifications and substitutions of parts and elements without departing from the spirit of the invention. Accordingly, the present invention is intended to encompass such rearrangements, modifications and substitutions of parts and elements as fall within the spirit and scope of the invention.

What is claimed is:

1. A solar cell unit comprising:
a plurality of spaced radiant energy converting cells having an energy receiving surface responsive to radiant energy received thereon for generating electric energy, and
a light reflective fin positioned between each adjacent pair of said converter cells, each fin being thermally and electrically connected to said pair of converter cells on either side thereof, the electrical connection on one side being to the energy receiving surface of the converter cell and on the opposite side to the surface of the adjacent cell opposite the energy receiving surface, said fins providing series electrical connection between the converter cells.

2. The solar cell unit according to claim 1 wherein said fins have a light emittance coating on one side thereof and are heat dissipating.

3. The solar cell unit according to claim 1 wherein said fins have a specularly reflective surface on one face thereof to direct radiant energy onto said converter cells.

4. The solar cell unit according to claim 1 wherein said light reflective fins are positioned at an angle of about 115° from the plane of said converter cell.

5. The solar cell unit according to claim 1 wherein said fins have a width of approximately 3.5 times the width of said converter cells.

6. The solar cell unit according to claim 1 wherein said converter cells are mutually parallel one to the other.

7. The solar cell unit according to claim 1 wherein said fins are mutually parallel one to the other.

8. The solar cell unit according to claim 1 wherein said light reflective fins include a three layer composite having a specularly reflective upper layer, an electrically and thermally conductive foil attached to the upper layer and a high emittance coating on the side of the foil opposite said reflective upper layer.

9. The solar cell unit according to claim 8 wherein each said radiant energy converter cell has an electrically conductive grid mounted on and in electrical contact with the energy receiving surface of the energy converter cells and further comprising:
first means for electrically connecting a first edge of said conductive foil to said grid, and
second means for electrically connecting a second edge of said conductive foil opposite said first edge to the surface of an adjacent converter cell opposite said grid.

10. The solar cell unit according to claim 9 wherein said first means includes a metallic flange electrically connected between said conductive foil and said grid.

11. The solar cell unit according to claim 9 wherein said second means includes an electrically and thermally conductive adhesive for connecting said conductive foil to said converter cell.

12. The solar cell unit according to claim 9 further comprising:
third means for thermally connecting the first end of said conductive foil to said converter cell.

13. The solar cell unit according to claim 12 wherein said second end of said conductive foil is connected to the face of said converter cell opposite the energy receiving surface thereof.

14. The solar cell unit according to claim 12 wherein said third means is an adhesive which is thermally conductive but electrically insulative.

15. The solar cell unit according to claim 9 further comprising a protective coating applied to the energy receiving surface of the converter cell and over said grid.

16. A solar cell unit comprising:
a plurality of spaced radiant energy converting cells having an energy receiving surface responsive to radiant energy received thereon to generate electric energy, and
a heat dissipating fin positioned between each adjacent pair of said converter cells, each fin being thermally and electrically connected to said pair of converter cells on either side thereof.

17. The solar cell unit according to claim 16 wherein the thermal connection of said fins to said converting cells is on the surface of said cells opposite the energy receiving side thereof.

18. The solar cell unit according to claim 16 wherein said fins have a high emittance coating on one side thereof to improve heat dissipation.

19. The solar cell unit according to claim 16 wherein said fins have a specularly reflective surface on one face thereof to direct radiant energy onto said converter cells.

20. The solar cell unit according to claim 16 wherein said fins are positioned at an angle of about 115° from the plane of said converter cell.

21. The solar cell unit according to claim 16 wherein said fins have a width of approximately 3.5 times the width of said converter cells.

22. The solar cell unit according to claim 16 wherein said converter cells are mutually parallel one to the other.

23. The solar cell unit according to claim 16 wherein said fins are mutually parallel one to the other.

24. The solar cell unit according to claim 16 wherein said fins include a three layer composite having a specularly reflective upper layer, an electrically and thermally conductive foil attached to the upper layer and a high emittance coating on the side of the foil opposite said reflective upper layer.

25. The solar cell unit according to claim 24 wherein said radiant energy converter cells have an electrically conductive grid mounted on and in electrical contact with the energy receiving surface of the energy converter cells and further comprising:
   first means for electrically connecting a first edge of said conductive foil to said grid, and
   second means for electrically connecting a second edge of said conductive foil opposite said first edge to the surface of an adjacent converter cell opposite said grid.

26. The solar cell unit according to claim 25 wherein said first means includes a metallic flange electrically connected between said conductive foil and said grid.

27. The solar cell unit according to claim 25 wherein said second means includes an electrically and thermally conductive adhesive for connecting said conductive foil to said converter cell.

28. The solar cell unit according to claim 25 further comprising:
   third means for thermally connecting the first edge of said conductive foil to said converter cell.

29. The solar cell unit according to claim 28 wherein said second end of said conductive foil is connected to the face of said converter cell opposite the energy receiving surface thereof.

30. The solar cell unit according to claim 28 wherein said third means is an adhesive which is thermally conductive but electrically insulative.

31. A solar collector comprising:
   a collector frame structure having a downwardly facing concave first curved portion of decreasing radius of curvature from the first end to the second end thereof, and an upwardly facing concave second curved portion with the first end thereof adjacent the second end of said first curved portion, said second curved portion decreasing in radius of curvature from the first end to the second end thereof, and
   a solar cell unit mounted on the concave surfaces of each of said first and second curved portions, said solar cell units having an energy receiving surface responsive to radiant energy received thereon to generate electric energy.

32. The solar collector according to claim 31 wherein said solar cell unit includes a plurality of radiant energy converter cells.

33. The solar collector according to claim 31 wherein said solar cell unit includes a plurality of spaced radiant energy converting cells having an energy receiving surface responsive to radiant energy received thereon for generating electric energy, and
   a plurality of light reflective fins positioned between said converter cells, each fin being thermally and electrically connected to said converter cells on either side thereof, the electrical connection on one side being to the energy receiving surface of the converter cell and on the opposite side to the surface of the adjacent cell opposite the energy receiving surface, said fins providing series electrical connection between the converter cells.

34. The solar collector according to claim 33 wherein said fins have a light emittance coating on one side thereof and are heat dissipating.

35. The solar collector according to claim 33 wherein said fins have a specularly reflective surface on one face thereof to direct radiant energy onto said converter cells.

36. The solar collector according to claim 33 wherein said light reflective fins are positioned at an angle of about 115° from the plane of said converter cell.

37. The solar collector according to claim 33 wherein said fins have a width of approximately 3.5 times the width of said converter cells.

38. The solar collector according to claim 33 wherein said converter cells are mutually parallel one to the other.

39. The solar collector according to claim 33 wherein said fins are mutually parallel one to the other.

40. The solar collector according to claim 33 wherein said fins include a three layer composite having a specularly reflective upper layer, an electrically and thermally conductive foil attached to the upper layer and a high emittance coating on the side of the foil opposite said reflective upper layer.

41. The solar collector according to claim 40 wherein each said radiant energy converter cell has an electrically conductive grid mounted on and in electrical contact with the energy receiving surface of the energy converter cells and further comprising:
   first means for electrically connecting a first edge of said conductive foil to said grid, and
   second means for electrically connecting a second edge of said conductive foil opposite said first edge to the surface of an adjacent converter cell opposite said grid.

42. The solar collector according to claim 41 wherein said first means includes a metallic flange electrically connected between said conductive foil and said grid.

43. The solar collector according to claim 41 wherein said second means includes an electrically and thermally conductive adhesive for connecting said conductive foil to said converter cell.

44. The solar collector according to claim 41 further comprising:
   third means for thermally connecting the first edge of said conductive foil to said converter cell.

45. The solar collector according to claim 44 wherein said second end of said conductive foil is connected to the face of said converter cell opposite the energy receiving surface thereof.

46. The solar collector according to claim 44 wherein said third means is an adhesive which is thermally conductive but electrically insulative.

47. The solar collector according to claim 41 further comprising a protective coating applied to the energy receiving surface of the converter cell and over said grid.

48. The solar collector according to claim 31 further comprising:
a primary reflector having a curvature with a reflective surface thereon, and
means for mounting said collector frame on the primary axis of said primary reflector such that light energy received by said primary deflector and deflected therefrom engages the radiant converter cells on said collector frame structure.

49. The solar collector according to claim 48 wherein said collector frame structure is positioned such that said point of adjacency of the second end of said first curved portion to the first end of said second curved portion is substantially on said primary axis of said primary reflector.

50. The solar collector according to claim 48 wherein said primary reflector includes a plurality of flexible ribs interconnected in a substantially parallel arrangement by a reflector beam structure connected to the ribs at a point intermediate of the ends of the ribs,
a central column extending substantially perpendicular from said reflector beam,
means for mounting said collector frame structure to said central column at a point spaced from said primary reflector, and
cable means attached between said collector frame structure and said ribs for flexing said ribs to produce the desired curvature for the reflective surface on the primary reflector.

51. The solar collector according to claim 50 wherein said cable means includes a cable structure from each end of each said rib to said collector frame structure.

52. The solar collector according to claim 51 wherein said reflector surface is a foil skin stretched to conform to the curvature of said flexible ribs.

53. The solar collector according to claim 51 wherein the overall height of said primary reflector is approximately four times the overall length of said collector frame structure.

54. The solar collector according to claim 51 wherein said primary reflector is semicircular in cross section.

55. The solar collector according to claim 51 wherein said primary reflector is parabolic in cross section.

56. A method of constructing an orbital solar powered electrical generator comprising:
(a) constructing component beam members on a constructing unit having moving means for moving said beam members to the base end of the constructing unit,
(b) assembling the beam members to form a substantially planar truss structure,
(c) constructing the components of a solar cell assembly on the constructing unit and assembling the components into a solar cell assembly,
(d) moving the assembled solar cell assembly to the base of the constructing unit for attachment to the truss structure, and
(e) moving the constructing unit along the truss assembly and repeating steps a through d above.

57. The method according to claim 56 further comprising:
moving each solar cell assembly in response to the flexure of the truss structure to maintain a desired alignment of the solar cell assemblies relative to the sun.

* * * * *